United States Patent
Hynecek

(10) Patent No.: US 9,159,753 B2
(45) Date of Patent: Oct. 13, 2015

(54) IMAGE SENSOR PIXELS WITH SELF-ALIGNED LATERAL ANTI-BLOOMING STRUCTURES

(71) Applicant: Semiconductor Components Industries, LLC, Phoenix, AZ (US)

(72) Inventor: Jaroslav Hynecek, Allen, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/189,687

(22) Filed: Feb. 25, 2014

(65) Prior Publication Data

US 2014/0247380 A1     Sep. 4, 2014

Related U.S. Application Data

(60) Provisional application No. 61/771,661, filed on Mar. 1, 2013.

(51) Int. Cl.
| | |
|---|---|
| *H04N 3/14* | (2006.01) |
| *H04N 5/335* | (2011.01) |
| *H01L 27/146* | (2006.01) |
| *H01L 31/062* | (2012.01) |
| *H01L 31/113* | (2006.01) |

(52) U.S. Cl.
CPC ...... *H01L 27/1461* (2013.01); *H01L 27/14612* (2013.01); *H01L 27/14654* (2013.01)

(58) Field of Classification Search
CPC ... H04N 5/361; H04N 5/363; H01L 27/14609
USPC ........ 348/294, 299, 300, 308, 241, 243, 248; 257/291–294, 233; 250/208.1
See application file for complete search history.

(56) References Cited

U.S. PATENT DOCUMENTS

| | | | |
|---|---|---|---|
| 8,471,315 B1* | 6/2013 | Hynecek et al. | 257/292 |
| 8,575,531 B2 | 11/2013 | Hynecek et al. | |
| 2006/0044432 A1* | 3/2006 | Stevens et al. | 348/294 |
| 2006/0255372 A1 | 11/2006 | Patrick et al. | |
| 2008/0007622 A1* | 1/2008 | Meisenzahl | 348/207.99 |
| 2008/0084490 A1* | 4/2008 | Masagaki | 348/308 |
| 2009/0190014 A1* | 7/2009 | Hong et al. | 348/297 |
| 2012/0235212 A1 | 9/2012 | Chen et al. | |

OTHER PUBLICATIONS

Nagaraja, U.S. Appl. No. 14/033,881, filed Sep. 23, 2013.

* cited by examiner

*Primary Examiner* — Kelly L Jerabek
(74) *Attorney, Agent, or Firm* — Treyz Law Group; Kendall P. Woodruff

(57) ABSTRACT

Pixels for solid-state CMOS image sensor arrays may be provided that have a lateral blooming control structure incorporated in them. The lateral blooming control structure is built as a separate structure from the charge transfer gate and it is fabricated in a self-aligned manner, which is particularly suitable for incorporating into small size pixels. The blooming control structure can be used for backside or for front side illuminated image sensors. When the lateral blooming control structure is provided with a separate bias means, it may also be used for the complete or partial charge removal from the photodiode and thus used in pixels that are designed for global shutter operation.

20 Claims, 4 Drawing Sheets

IMAGE SENSOR PIXELS WITH SELF-ALIGNED LATERAL ANTI-BLOOMING STRUCTURES

This application claims the benefit of provisional patent application No. 61/771,661, filed Mar. 1, 2013, which is hereby incorporated by reference herein in its entirety.

BACKGROUND

This relates to solid-state image sensors and, more specifically, to image sensors with pixels having self-aligned lateral anti-blooming structures.

Typical image sensors sense light by converting impinging photons into electrons or holes that are integrated (collected) in sensor pixels. After completion of an integration cycle, collected charge is converted into a voltage, which is supplied to the output terminals of the sensor. In complementary metal oxide semiconductor (CMOS) image sensors, the charge to voltage conversion is accomplished directly in the pixels themselves and the analog pixel voltage is transferred to the output terminals through various pixel addressing and scanning schemes. The analog signal can be also converted on-chip to a digital equivalent before reaching the chip output. The pixels have incorporated in them a buffer amplifier, typically a Source Follower (SF), which drives the sense lines that are connected to the pixels by suitable addressing transistors.

After charge to voltage conversion is completed and the resulting signal transferred out from the pixels, the pixels are reset in order to be ready for accumulation of new charge. In pixels that use a Floating Diffusion (FD) as the charge detection node, the reset is accomplished by turning on a reset transistor that conductively connects the FD node to a voltage reference, which is typically the pixel drain node. This step removes collected charge; however, it also generates kTC-reset noise as is well known in the art. This kTC-reset noise is removed from the signal using a Correlated Double Sampling (CDS) signal processing technique in order to achieve the desired low noise performance. CMOS image sensors that utilize a CDS technique usually include three transistors (3T) or four transistors (4T) in the pixel, one of which serves as the charge transferring (Tx) transistor. It is possible to share some of the pixel circuit transistors among several photodiodes, which also reduces the pixel size. An example of a 4T pixel circuit with pinned photodiode can be found in U.S. Pat. No. 5,625,210 to Lee, incorporated herein as a reference.

FIG. 1 is a simplified cross-sectional view of a portion of a typical image sensor pixel 100. As shown in FIG. 1, image sensor pixel 100 includes a pixel photodiode (PD) that collects the photon-generated carriers, a charge transfer gate 110 of a charge transfer transistor, and a floating diffusion 104. The pixel is fabricated in a substrate 101, that has a p+ doped layer 102 deposited on a back surface. The device substrate 101 also includes an epitaxial p-type doped layer 115 situated above the p+ type doped layer 102. The photons that enter this region generate carriers that are collected in the potential well of the photodiode (PD) formed in region 108.

The surface of epitaxial layer 115 is covered by an oxide layer 109 that isolates the doped poly-silicon charge transfer gate Tx 110 from the substrate. A masking cap oxide 111 is deposited on an upper surface of poly-silicon gate 110, which serves as a patterning hard mask as well as an additional blocking mask for the ion implantation that forms the PD charge storage region. The PD is formed by an n-type doped layer 108 and a p+ type doped potential pinning layer 107.

Sidewall spacers 116 are sometimes incorporated to control the mutual edge positions of p+ type doped layer 107 and charge storage layer 108. The FD diode 104 that senses charge transferred from the PD is connected to the pixel source follower SF transistor (not shown). The FD, SF, and the remaining pixel circuit components are all built in the p-type doped well 103 that diverts photon-generated charge into the photodiode potential well located in layer 108. The pixels are isolated from each other by p+ type doped regions 105 and 106, which may extend all the way to the p+ type doped layer 102. The whole pixel is covered by several inter-level (IL) oxide layers 112 (only one is shown in FIG. 1) that are used for pixel metal wiring and interconnect isolation. The pixel active circuit components are connected to the wiring by metal via plugs 114 deposited through contact holes 113.

In one conventional approach, blooming control in pixels of the type shown in FIG. 1 is accomplished by continuously pulsing the Tx gate from off state to the partial on state and draining some of the accumulated charge (which has already almost filled the PD well) to the FD, and from the FD to the array drain using the reset operation. Another conventional approach is to form a buried channel between the PD n-type layer 108 that is integrating charge and the FD under the Tx gate. This channel is built in the p-well region 103 by suitable n-type implants or it is formed naturally when the FD and the n-layer 108 are close enough.

Conventional approaches to blooming control often sacrifice pixel performance in an effort to provide efficient blooming control. For example, while a conventional pixel may be provided with satisfactory blooming control, the pixel may be vulnerable to dark current generation and may experience other issues that in turn lead to image artifacts such as image lag.

It may therefore be desirable to be able to provide improved image sensor pixels with anti-blooming arrangements that do not sacrifice pixel performance.

BRIEF DESCRIPTION OF THE DRAWINGS

FIG. 1 is a cross-sectional side view of a conventional image sensor pixel in which anti-blooming is accomplished either by clocking a charge transfer gate during integration or by biasing the charge transfer gate only partially on.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to as pixels or image pixels). The image pixels in the image sensors may include photosensitive elements such as photodiodes that convert the incoming light into electric charge. The electric charge may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
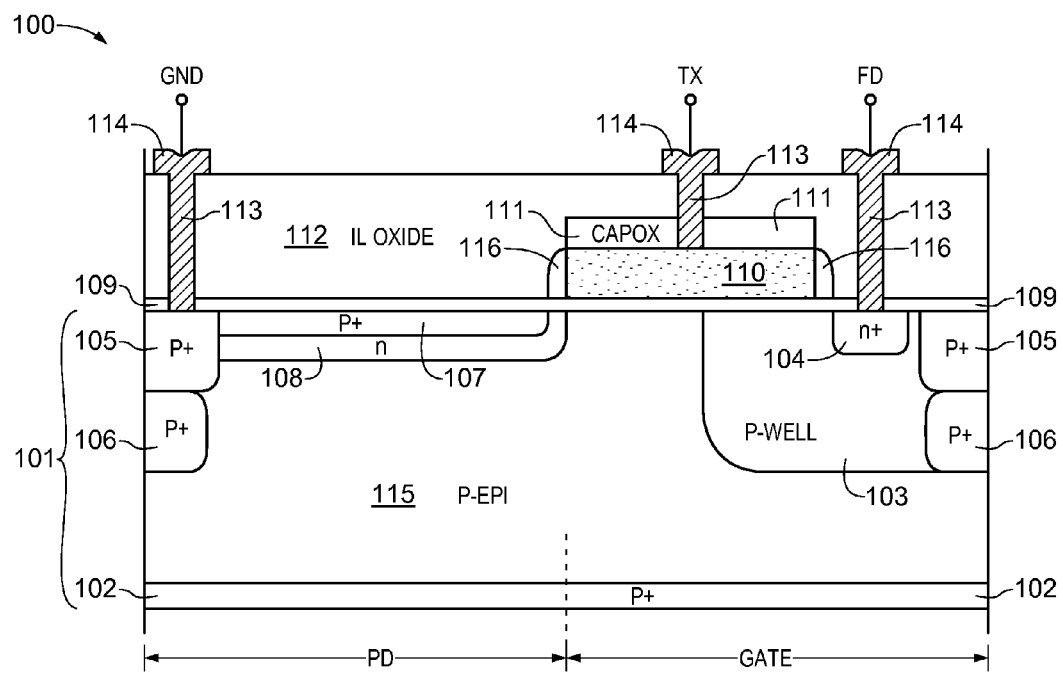
Figure 2:
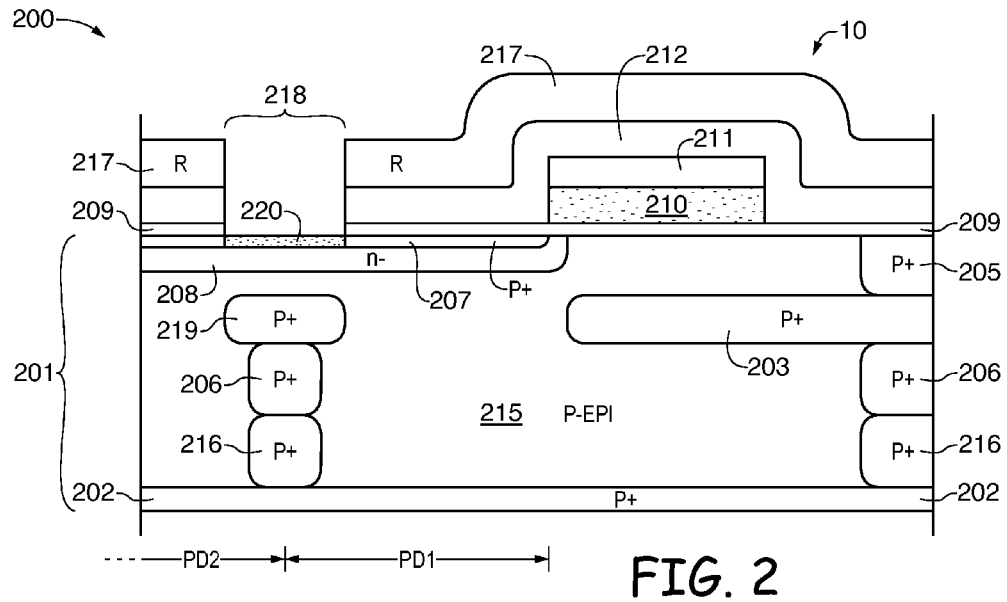
FIG. 2 is a cross-sectional side view of an illustrative image sensor pixel showing the first steps of formation of an anti-blooming drain structure with a deep p+ type doped barrier implant in accordance with an embodiment of the present invention.
Figure 3:
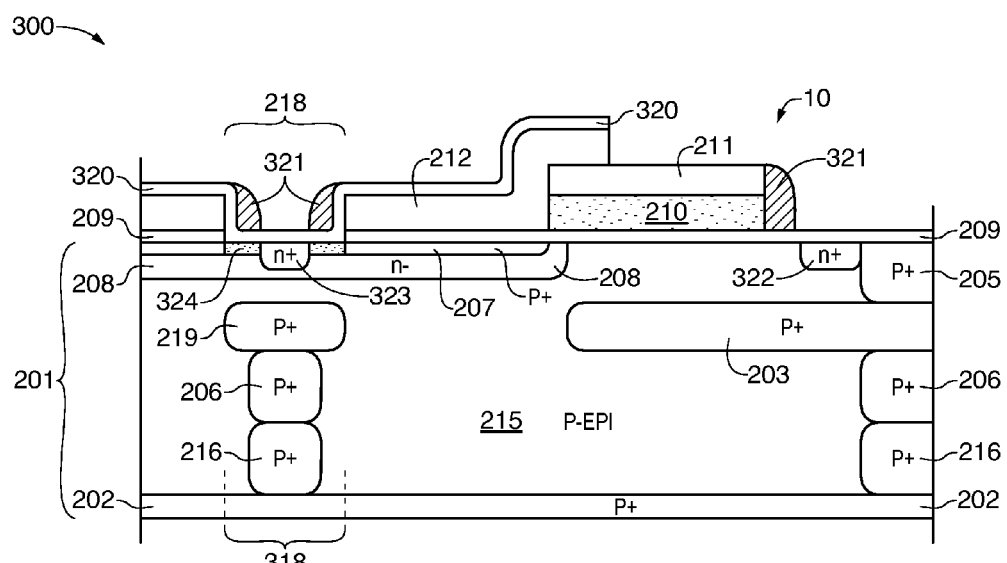
FIG. 3 is a cross-sectional side view of an illustrative image sensor pixel showing the anti-blooming drain structure after spacer and n+ type doped drain implantation steps have been completed in accordance with an embodiment of the present invention.
Figure 4:
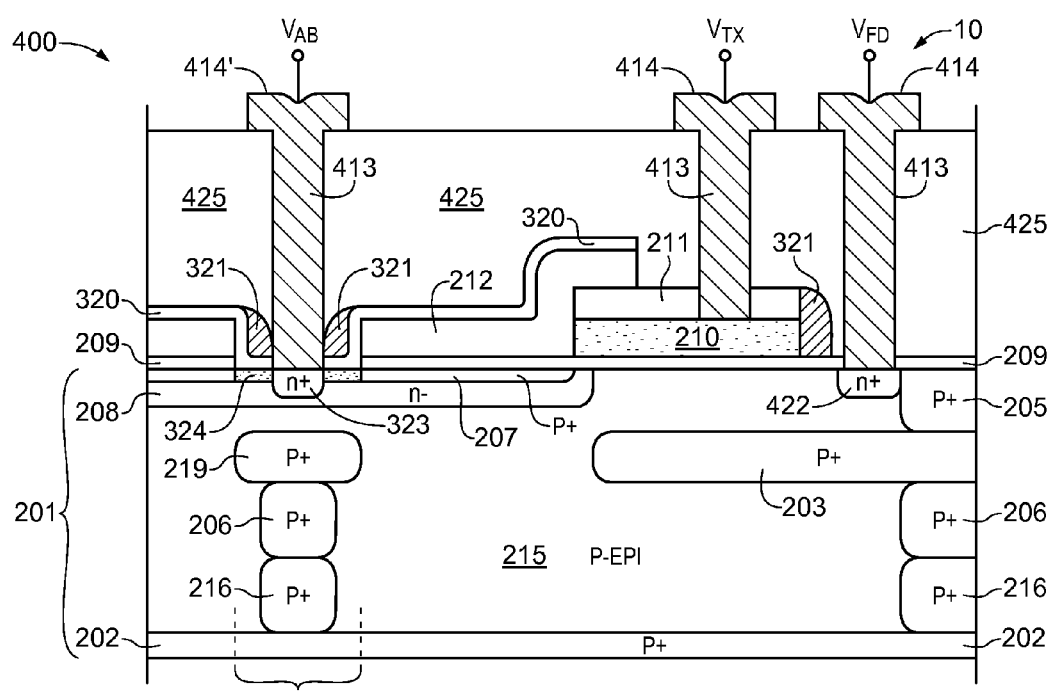
FIG. 4 is a cross-sectional side view of an illustrative image sensor pixel showing the anti-blooming drain structure after a planarization oxide layer has been deposited, a contact via has been formed, and metal plugs have been deposited to connect active device regions to metal interconnects in accordance with an embodiment of the present invention.

Image sensor pixels may include a mechanism for draining overflow charge so that the overflow charge does not spill into neighboring pixels when a pixel is overexposed. The present disclosure describes such a mechanism that is particularly suitable for small size pixels that are illuminated from the back of the substrate. However, if desired, the anti-blooming mechanism may also be used in front side illuminated image sensors. Small pixel size may reduce the cost of an image sensor, but it is important not to sacrifice image sensor performance when the pixel size is reduced. This disclosure describes the method of building a small anti-blooming drain structure that does not consume a large pixel area. The anti-blooming structure is integrated into the pixel fabrication process in a self-aligned manner, and provides an efficient blooming control mechanism. FIGS. 2-4 show various stages of the fabrication process used to form an illustrative image sensor pixel having a self-aligned lateral anti-blooming structure.

FIG. 2 is a simplified cross-sectional side view of an illustrative image sensor pixel 10 at fabrication step 200. At fabrication step 200, pixel 10 is at a suitable stage in the fabrication process where an anti-blooming region such as anti-blooming region 218 may be formed. The example of FIG. 2 is merely illustrative, however. It should be understood that the anti-blooming structure may be integrated into image sensor pixel 10 in other suitable stages of the fabrication process (e.g., other suitable stages of a standard CMOS fabrication process).

As shown in FIG. 2, image sensor pixel 10 may include a device substrate such as silicon substrate 201. Substrate 201 may include a p+ type doped layer 202 and an epitaxial p-type doped layer such as p-type epitaxial layer 215 situated above p+ type doped layer 202. Photons that enter this region may generate carriers that are collected in the potential well of the photodiode (PD) formed in region 208. The use of p+ type doped layer 202 may help prevent the generation of excessive dark current by the interface states.

The surface of epitaxial layer 215 may be covered by an oxide layer such as oxide layer 209. Oxide layer 209 may be used to isolate a doped poly-silicon charge transfer (Tx) gate such as charge transfer gate 210 from substrate 201. A masking cap oxide such as masking cap oxide 211 may be deposited on an upper surface of poly-silicon gate 210, which serves as a patterning hard mask as well as an additional blocking mask for the ion implantation that forms the PD charge storage region. The PD is formed by n-type doped layer 208 and p+ type doped potential pinning layer 207, which may help reduce the interface states generated dark current (similarly to p+ type doped layer 202).

Pixels may be isolated from each other by several p-type doped implants such as p-type doped implants 205, 206, and 216. A deep p+ type doped layer such as p+ type doped layer 203 may be deposited under charge transfer gate 210 to direct the flow of photo-generated electrons to pinned photo-diode region PD. Charge transfer gate 210 may be isolated from silicon substrate 201 by a thermally grown gate oxide layer such as oxide layer 209.

At fabrication step 200, poly-silicon gate 210 and gap oxide 211 may be fabricated, along with pinning p+ doped layer 207 and charge storing layer 208. As described above, anti-blooming structures may be integrated into pixels such as pixel 10 in other stages of the fabrication process (if desired).

Anti-blooming structure formation may begin with the deposition of photoresist such as photoresist 217 on top of inter-level oxide layer 212. Photoresist 217 and oxide layer 212 may then be etched to remove portions of photoresist 217 and oxide layer 212 in anti-blooming region 218 and to thereby form an opening in anti-blooming region 218. A p+ doped region such as p+ doped region 219 (sometimes referred to as a barrier implant) may be implanted into silicon substrate 201 under the opening in region 218. If desired, p+ doped region 219 may be implanted into substrate 201 after layers 217 and 212 are etched. If desired, an additional shallow compensation n-type implant such as n-type implant 220 may be formed in region 218 to control the lateral electric field (e.g., in cases where p+ layer 207 is heavily doped).

FIG. 3 is a cross-sectional side view of pixel 10 of FIG. 2 after additional processing steps have been completed. At stage 300 of the fabrication process, photoresist 217 (FIG. 2) may be removed. An additional oxide layer such as oxide layer 320 may be deposited over oxide layer 212 and in the opening in the region 218. Spacer structures such as spacer structures 321 may then be formed on the sidewall of charge transfer gate 210 and in anti-blooming region 218. Spacer structures 321 may, for example, be formed from nitride or other suitable material. The nitride may be deposited over the surface of pixel 10 and etched so that only spacer structures 321 remain.

Following formation of spacer structures 321, an anti-blooming drain such as n+ doped drain 323 may be deposited in substrate 201. Using spacer structures 321 may allow for self-aligned deposition of n+ doped drain 323. For example, the presence of spacer structures 321 may ensure that the edges of n+ doped drain 323 align with the sidewall surfaces of spacer structures 321. Proper alignment of n+ doped drain 323 may ensure the proper definition of potential and may also ensure that the left-right symmetry in the anti-blooming channel between deep p+ type doped implant 219 and p-type doped layer 324 is maintained. As shown in FIG. 3, p-type doped layer 324 may partially surround n+ type doped drain 323. If desired, p-type doped layer 324 may only be partially compensated by n-type doped implant 220 (FIG. 2).

If desired, anti-blooming structure 318 may be used to control blooming in more than one pixel. For example, anti-blooming structure 318 may be used to drain overflow charge from two or more adjacent pixels (e.g., PD1 and PD2 of FIG. 2). Using a single anti-blooming structure for multiple pixels may help save space in the image sensor.

As shown in FIG. 3, n+ doped FD region 322 may also be formed in silicon substrate 201 at stage 300 of the fabrication process.

FIG. 4 is a cross-sectional side view of pixel 10 of FIG. 3 after additional processing steps have been completed. At stage 400 of the fabrication process, additional IL oxide layers such as IL oxide layer 425 may be deposited and planarized. After depositing and planarizing IL oxide layer 425, contact via holes 413 may be etched into the IL oxide layers. Because spacer structures 321 are formed from a material that is resistant to oxide etching (e.g., nitride or other suitable material), spacer structures 321 remain in place after forming contact via holes 413. The stack of IL oxide layers on the surface of silicon substrate 201 is sometimes referred to as an interconnect stack.

Contact via holes 413 may then be filled with conductive material such as metal vias 414 (sometimes referred to as metal plugs). The presence of spacer structures 321 ensures that metal contact 414' is properly aligned with n+ doped layer 323. For example, since the sidewall surfaces of spacer structures 321 are aligned with the edges of n+ doped layer 323, conductive material 414' is automatically aligned with n+ doped layer 323 (i.e., contact 414' is self-aligned with n+ doped layer 323). Self-aligned processing steps are important particularly during the fabrication of small pixels, where a small amount of misalignment can significantly contribute to pixel-to-pixel response non-uniformity. Because spacer structures 321 are used to automatically align contact 414' with n+ doped drain 323, spacer structures 321 are sometimes referred to as alignment structures.

As shown in FIG. 4, anti-blooming structure 318 is formed by deep p+ type doped region 219, the surface p+ type doped region 324 and n+ type doped drain 323. Providing a suitable bias (e.g., a positive bias voltage $V_{AB}$) to the drain 323 causes overflow charge from the PD to flow to this drain. If desired, some or all of the charge in the PD may be removed by biasing drain 323 high. Charge removal (e.g., complete charge removal from the PD) may be important when pixel 10 is operated in global shutter mode. Thus, a separate bias line may be provided for anti-blooming drain 323 (if desired).

Figure 5:
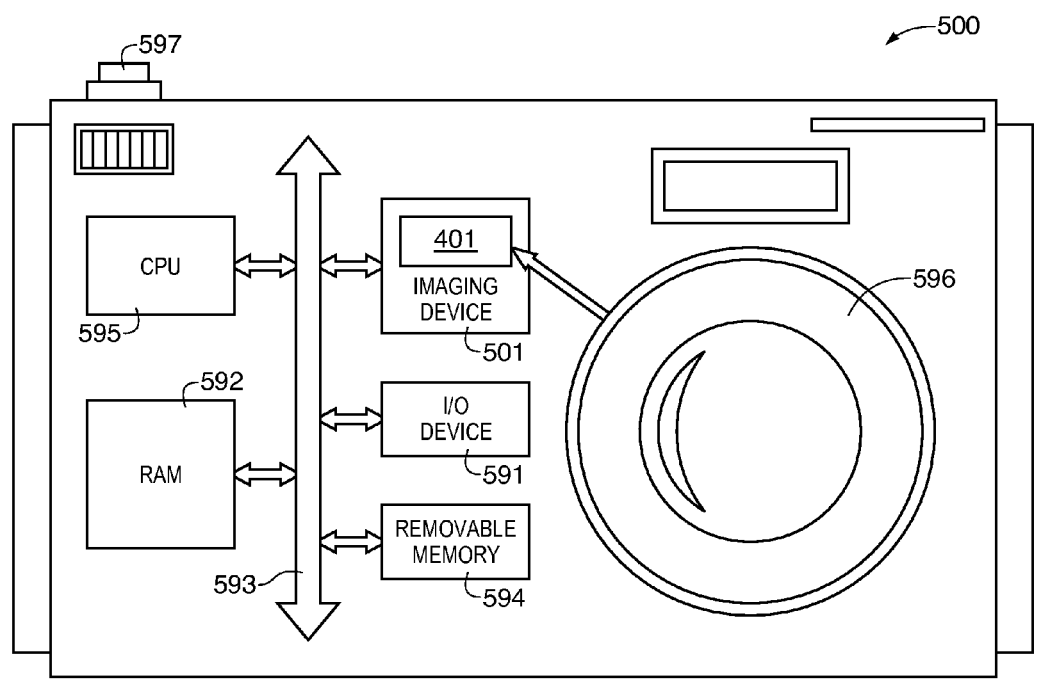
FIG. 5 is a block diagram of a system employing the embodiments of FIGS. 2, 3, and 4 in accordance with an embodiment of the present invention.

FIG. 5 shows in simplified form a typical processor system 500, such as a digital camera, which includes an imaging device 501. Imaging device 501 may include a pixel array 401 having pixels of the type shown in FIG. 4 (e.g., pixel array 401 may be an array of pixels 10) formed on an image sensor SOC. Processor system 500 is exemplary of a system having digital circuits that may include imaging device 501. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 401 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 501 may also communicate with CPU 595 over bus 593. System 500 may include random access memory (RAM) 592 and removable memory 594. Removable memory 594 may include flash memory that communicates with CPU 595 over bus 593. Imaging device 501 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an image sensor having image pixels that incorporate the lateral overflow anti-blooming structure, have low dark current, and allow a complete charge transfer from the PD. This is accomplished by placing a separate anti-blooming barrier and drain structure in the pixel isolation region. The anti-blooming structure may control blooming by removing overflow charge independently of the operation of the pixel transfer gate.

The separate anti-blooming structure allows more flexibility in the design of the transfer gate. For example, by forming a separate anti-blooming structure in the pixel, the silicon to silicon dioxide interface under the transfer gate may be pinned to minimize dark current generation under the transfer gate.

The anti-blooming structure may also allow for a complete charge removal from the PD when desired (e.g., in image sensors that operate in global shutter mode). This helps to avoid having any residual charge left on the PD, which in turn helps to prevent artifacts such as image lag.

The blooming control structure is fabricated in a self-aligned manner to ensure that pixel-to-pixel uniformity is maintained, which is of particular importance for smaller pixels.

The described details in this disclosure are intended to be illustrative and not limiting; it is noted that persons skilled in the art can make modifications and variations in light of the above teachings. It is therefore to be understood that changes may be made in the particular embodiments of the invention disclosed, which are within the scope and spirit of the invention as defined by the appended claims. The foregoing is merely illustrative of the principles of this invention which can be practiced in other embodiments.

What is claimed is:

1. An image sensor pixel in an image sensor having a silicon substrate and an interconnect stack formed on a surface of the silicon substrate, wherein the interconnect stack comprises a plurality of oxide layers, the image sensor pixel comprising:
    a photodiode formed in the surface of the silicon substrate;
    a transfer gate formed on the surface of the silicon substrate, wherein the transfer gate is configured to transfer charge from the photodiode to a floating diffusion;
    a blooming control structure, wherein the blooming control structure is configured to remove overflow charge from the photodiode and wherein the blooming control structure is separate from the transfer gate; and
    a conductive contact material in the interconnect stack that provides a bias voltage to the blooming control structure, wherein the conductive contact material is in contact with the surface of the silicon substrate and is at least partially surrounded by spacer structures that align the conductive contact material with the blooming control structure.

2. The image sensor pixel defined in claim 1 wherein the blooming control structure comprises:
    a deep p+ type doped region formed in the silicon substrate below the conductive contact material;
    an n+ type doped drain formed at the surface of the silicon substrate and in contact with the conductive contact material; and
    a potential pinning p+ type doped region of the photodiode that at least partially surrounds the n+ type doped drain.

3. The image sensor pixel defined in claim 2 wherein the spacer structures are formed from nitride.

4. The image sensor pixel defined in claim 2 wherein the image sensor pixel is operable in global shutter mode and wherein the blooming control structure is configured to completely remove charge from the photodiode.

5. The image sensor pixel defined in claim 2 wherein the potential pinning p+ type doped region of PD is partially compensated by an n-type doped implant.

6. The image sensor pixel defined in claim 2 wherein the image sensor pixel is separated from other image sensor pixels in the image sensor by a plurality of p-type doped implants and wherein the deep p+ type doped region is interposed between the n+ type doped drain and the plurality of p-type doped implants.

7. The image sensor defined in claim 2 wherein the spacer structures have sidewall surfaces that align with edges of the n+ type doped drain of the blooming control structure.

8. A method for forming an anti-blooming structure in an image sensor, wherein the image sensor includes a silicon substrate, a photodiode formed in a surface of the silicon substrate, and a transfer gate formed on the surface of the silicon substrate, the method comprising:
    depositing an oxide layer and a photoresist layer over the transfer gate and over the surface of the silicon substrate;
    etching the photoresist layer and the oxide layer to form an opening in an anti-blooming region, wherein the anti-blooming region is laterally separated from the transfer gate;
    depositing alignment structures in the opening; and
    forming the anti-blooming structure in the silicon substrate under the opening, wherein the anti-blooming structure is configured to drain excess charge from the photodiode; and
    using the alignment structures, forming a conductive contact material in the opening, wherein the conductive contact material provides a bias voltage to the anti-blooming structure.

9. The method defined in claim 8 wherein forming the anti-blooming structure comprises:
    implanting a deep p+ type doped region into the silicon substrate; and
    forming a surface p+ type doped region in the surface of the silicon substrate, wherein the deep p+ type doped region and the surface p+ type doped region are aligned with the opening.

10. The method defined in claim 9 wherein forming the anti-blooming structure further comprises:
    using the alignment structures, implanting an n+ type doped drain in the surface of the silicon substrate, wherein the alignment structures have sidewall surfaces that align with edges of the n+ doped drain.

11. The method defined in claim 10 wherein depositing the alignment structures comprises depositing and etching a layer of nitride on the surface of the silicon substrate and in the opening.

12. The method defined in claim 10 further comprising:
    after forming the anti-blooming structure in the silicon substrate, depositing additional oxide layers over the silicon substrate; and
    etching a plurality of via holes in the additional oxide layers, wherein the alignment structures are resistant to oxide etching.

13. The method defined in claim 12 wherein forming the conductive contact material comprises forming the conductive contact material in one of the via holes to form an electrical connection with the n+ type doped drain, wherein the alignment structures automatically align the conductive contact material with the n+ type doped drain.

14. A system, comprising:
    a central processing unit;
    memory;
    input-output circuitry; and
    an imaging device, wherein the imaging device comprises an image pixel array having a silicon substrate and an interconnect stack formed on a surface of the silicon substrate, wherein the interconnect stack comprises a plurality of oxide layers, and wherein an image sensor pixel in the image pixel array comprises:
    a photodiode formed in the surface of the silicon substrate;
    a transfer gate formed on the silicon substrate, wherein the transfer gate is configured to transfer charge from the photodiode to a floating diffusion;
    a blooming control structure, wherein the blooming control structure is configured to remove overflow charge from the photodiode and wherein the blooming control structure is separate from the transfer gate; and
    a conductive contact material in the interconnect stack that provides a bias voltage to the blooming control structure, wherein the conductive contact material is in contact with the surface of the silicon substrate and is at least partially surrounded by spacer structures that align the conductive contact material with the blooming control structure.

15. The system defined in claim 14 wherein the blooming control structure comprises:
    a deep p+ type doped region formed in the silicon substrate below the conductive contact material;
    an n+ type doped drain formed at the surface of the silicon substrate and in contact with the conductive contact material; and
    a potential pinning p+ type doped region of the photodiode that at least partially surrounds the n+ type doped drain.

16. The system defined in claim 15 wherein the spacer structures are formed from nitride.

17. The system defined in claim 15 wherein the image sensor pixel is operable in global shutter mode and wherein the blooming control structure is configured to completely remove charge from the photodiode.

18. The system defined in claim 15 wherein the potential pinning p+ type doped region of the photodiode is partially compensated by an n-type doped implant.

19. The system defined in claim 15 wherein the image sensor pixel is separated from other image sensor pixels in the image pixel array by a plurality of p-type doped implants and wherein the deep p+ type doped region is interposed between the n+ type doped drain and the plurality of p-type doped implants.

20. The system defined in claim 15 wherein the spacer structures have sidewall surfaces that align with edges of the n+ type doped drain of the blooming control structure.

* * * * *